(12) United States Patent
Kim (10) Patent No.: US 10,159,147 B2
(45) Date of Patent: Dec. 18, 2018

(54) DISPLAY APPARATUS

(71) Applicant: LG DISPLAY CO., LTD., Seoul (KR)

(72) Inventor: Sung Hun Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 195 days.

(21) Appl. No.: 14/832,437

(22) Filed: Aug. 21, 2015

(65) Prior Publication Data

US 2016/0113106 A1 Apr. 21, 2016

(30) Foreign Application Priority Data

Oct. 20, 2014 (KR) .................. 10-2014-0141901

(51) Int. Cl.

| | | |
|---|---|---|
| *H05K 1/18* | (2006.01) | |
| *H05K 1/02* | (2006.01) | |
| *G04G 17/04* | (2006.01) | |
| *G02F 1/1333* | (2006.01) | |
| *H01L 51/52* | (2006.01) | |
| *G04G 17/02* | (2006.01) | |
| *G02F 1/1345* | (2006.01) | |

(52) U.S. Cl.
CPC .......... *H05K 1/028* (2013.01); *G02F 1/1333* (2013.01); *G04G 17/02* (2013.01); *G04G 17/045* (2013.01); *H01L 51/5246* (2013.01); *H05K 1/181* (2013.01); *G02F 1/13338* (2013.01); *G02F 1/13452* (2013.01); *G02F 1/133308* (2013.01); *G02F 2001/133317* (2013.01); *G02F 2001/133331* (2013.01); *G02F 2001/133388* (2013.01); *G02F 2201/503* (2013.01); *G02F 2201/56* (2013.01); *H05K 2201/10128* (2013.01)

(58) Field of Classification Search
CPC ...... H05K 1/028; H05K 1/181; G04G 17/045; G02F 1/13308; G02F 1/13452; G02F 1/133317
See application file for complete search history.

(56) References Cited

U.S. PATENT DOCUMENTS

| | | | |
|---|---|---|---|
| 6,243,259 B1 | 6/2001 | Yamakawa et al. | |
| 6,812,974 B1* | 11/2004 | Hinata | G02B 6/0086 349/12 |
| 7,256,856 B2* | 8/2007 | Imaeda | G02F 1/13452 349/145 |
| 7,932,893 B1* | 4/2011 | Berthaud | G04G 21/00 178/18.06 |
| 8,866,759 B2* | 10/2014 | Furusawa | G06F 1/1626 345/173 |
| 9,582,042 B2* | 2/2017 | Seo | G06F 1/1643 |
| 9,674,957 B2* | 6/2017 | Kang | H05K 1/14 |

(Continued)

FOREIGN PATENT DOCUMENTS

| | | |
|---|---|---|
| CN | 102196072 A | 9/2011 |
| CN | 102445798 A | 5/2012 |

(Continued)

*Primary Examiner* — Nathan Milakovich
(74) *Attorney, Agent, or Firm* — Dentons US LLP (57) ABSTRACT

Disclosed is a display apparatus having a circular display portion, wherein the display apparatus includes a cover window for covering a circular display portion on a substrate, and an insertion member provided in a gap space between an edge of the substrate and an edge of the cover window, thereby improving reliability of the substrate.

18 Claims, 9 Drawing Sheets

(56) References Cited

U.S. PATENT DOCUMENTS

| | | |
|---|---|---|
| 2004/0256996 A1 | 12/2004 | Osame et al. |
| 2009/0115942 A1* | 5/2009 | Watanabe ......... G02F 1/133305 349/96 |
| 2009/0213534 A1 | 8/2009 | Sakai |
| 2011/0221688 A1 | 9/2011 | Byun et al. |
| 2012/0092817 A1 | 4/2012 | Shibahara et al. |
| 2012/0120364 A1* | 5/2012 | Wu ....................... G02F 1/1339 349/153 |
| 2012/0314546 A1 | 12/2012 | Brewer et al. |
| 2013/0314881 A1 | 11/2013 | Cho et al. |
| 2014/0240961 A1 | 8/2014 | Tsubaki et al. |
| 2015/0153594 A1* | 6/2015 | Sato ................... G02F 1/13452 349/122 |
| 2015/0201492 A1* | 7/2015 | Kim ....................... H05K 1/028 361/749 |

FOREIGN PATENT DOCUMENTS

| | | |
|---|---|---|
| CN | 203150021 U | 8/2013 |
| EP | 1079259 A1 | 2/2001 |
| JP | 49-128271 U1 | 11/1974 |
| JP | 53-142271 A | 12/1978 |
| JP | 59-034172 U1 | 3/1984 |
| JP | 2001-075075 A | 3/2001 |
| JP | 2001-109571 A | 4/2001 |
| JP | 2007-285743 A | 11/2007 |
| JP | 2014-164276 A | 9/2014 |

\* cited by examiner

DISPLAY APPARATUS

CROSS REFERENCE TO RELATED APPLICATIONS

This application claims the benefit of the Korean Patent Application No. 10-2014-0141901 filed on Oct. 20, 2014, which is hereby incorporated by reference for all purposes as if fully set forth herein.

BACKGROUND OF THE INVENTION

Field of the Invention

The present invention relates to a display apparatus and a method of manufacturing the same, and more particularly, to a display apparatus having a circular display portion.

Discussion of the Related Art

Generally, display apparatuses have been widely used as the screens of various products such as televisions, notebook computers and monitors as well as portable electronic devices such as mobile communication terminals, electronic diaries, electronic books, portable multimedia players (PMPs), navigation systems, ultra mobile PCs (UMPCs), mobile phones, smart phones, tablet PCs (personal computers) and watch phones.

Studies for developing flexible display apparatuses have been made, focusing on liquid crystal display apparatuses, organic light emitting display apparatuses and electrophoretic display apparatuses due to their slim sizes.

An organic light emitting display apparatus displays a desired picture image by controlling an amount of current that flows from a pixel power line to the organic light emitting diode in accordance with a data signal. Such an organic light emitting display apparatus typically has a rectangular display screen due to arrangement structures of signal lines, pixel driving power lines and driving circuits.

Recently, as appearance and design of display apparatuses have become more important and consumers' attention to wearable devices such as watch phones has increased, studies and developments of a display apparatus having a circular display screen, not a rectangular display screen, have been made.

Figure 1:
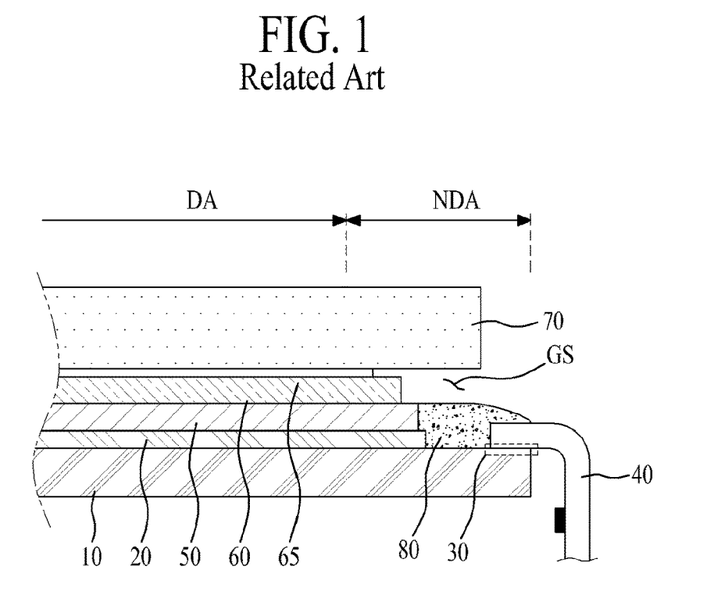
FIG. 1 is a cross-sectional view illustrating some parts of a display apparatus having a circular display portion according to the related art.

FIG. 1 is a cross-sectional view illustrating some parts of a display apparatus having a circular display portion according to the related art.

Referring to FIG. 1, the display apparatus having a circular display portion according to the related art is formed of a plastic material. The display apparatus includes a substrate 10 having a circular display area (DA) and a non-display area (NDA) in a periphery of the display area (DA), the display portion 20 in the display area (DA) of the substrate 10, a pad 30 at one side of the non-display area (NDA) of the substrate 10, a flexible printed circuit board 40 attached to the pad 30 and provided to supply signals to the display portion 20 through the pad 30, a barrier film 50 on the display portion 20 that is provided to cover an upper surface of the substrate 10 except the pad 30, a polarizing film 60 attached to an upper surface of the barrier film 50, a cover window 70 attached to an upper surface of the polarizing film 60 by the use of transparent adhesive 65 and provided to cover the upper surface of the substrate 10, and a resin coating layer 80 coated and cured at a connection portion between the flexible printed circuit board 40 and the pad 30 of the substrate 10.

The display portion 20 may include an organic light emitting diode (not shown) and a pixel circuit (not shown) that controls the organic light emitting diode to emit light in accordance with a signal supplied from the flexible printed circuit board 40 via the pad 30.

A gap space (GS) may exist between the substrate 10 and the cover window 70 at a driving circuit connecting portion of the display apparatus according to the related art. The gap space (GS) at the driving circuit connecting portion may facilitate connecting the flexible printed circuit board 40 with the pad 30 of the substrate 10, attaching the polarizing film 60 and coating the transparent adhesive 65 during the manufacturing processes.

The gap space (GS) may cause micro-cracks to occur on the substrate 10 due to an external force, such as bonding force or adhering force applied to the substrate 10, during a direct bonding process for attaching the cover window 70 to the upper surface of the polarizing film 60, thereby lowering reliability of the substrate 10.

The gap space (GS) may be sealed by the resin coating layer 80 used to improve adhesiveness between the flexible printed circuit board 40 and the pad 30 of the substrate 10. However, it may be difficult to fill the resin coating layer 80 in the gap space (GS). Also, if a thickness of the resin coating layer 80 increases, a processing time for curing the resin coating layer 80 increases, thereby decreasing productivity. Moreover, the resin coating layer 80 filled in the gap space (GS) may spread during the attachment process of the cover window 70, which may contaminate a peripheral area of the display apparatus. In order to prevent such a contamination at the peripheral area, an additional process such as forming a separate dam structure may be needed.

The above description for the display apparatus having the circular display portion using the organic light emitting diode is technical information which was possessed by the inventor when deriving some or part of the present invention. Thus, the above description may not be prior art.

SUMMARY OF THE INVENTION

Accordingly, the present invention is directed to a display apparatus and method for manufacturing the same that substantially obviates one or more of the problems due to limitations and disadvantages of the related art.

An advantage of the present invention is to provide to provide a display apparatus having a circular display portion with improved reliability.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a display apparatus may, for example, include a display portion including a plurality of pixels and a driving circuit connecting portion outside the display portion on a substrate; a plurality of display pads in the driving circuit connecting portion that are electrically connected to the plurality of pixels, respectively; a cover window on the substrate that covers the display portion and exposes a part of the substrate; and an insertion member in the driving circuit connecting portion in a gap space between the substrate and the cover window, wherein the insertion member is extended over to the exposed part of the substrate.

At this time, the cover window may be formed in a circular shape for covering the display portion, and the insertion member may be formed in a polygonal shape overlapped with the edge of the cover window.

The substrate may further include a cathode power supply line and a driving power supply line connected with a pixel prepared in the display portion, wherein the cathode power supply line may be prepared between the display portion and the driving power supply line prepared in an edge of a circular arc portion of the substrate.

In another aspect of the present invention, a display apparatus may, for example, include a display portion having a circular shape on a circular arc portion of a substrate, the substrate including the circular arc portion and a driving circuit connecting portion protruding from one side of the circular arc portion; a cover window on the substrate that covers the display portion; and an insertion member in a gap space between an edge of the substrate and an edge of the cover window, and interposed between the driving circuit connecting portion and the cover window.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to exemplary embodiments of the present invention, examples of which are illustrated in the accompanying drawings. Wherever possible, the same reference numbers will be used throughout the drawings to refer to the same or like parts. In the following description, detailed description of known elements or functions may be omitted.

Terms disclosed in this specification should be understood as follows.

The term of a singular expression should be understood to include a multiple expression as well as the singular expression if there is no specific definition in the context. The terms such as "the first" and "the second" are used only to differentiate one element from other elements. Thus, a scope of claims is not limited by these terms. Also, it should be understood that the term such as "include" or "have" does not preclude existence or possibility of one or more features, numbers, steps, operations, elements, parts or their combinations. It should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Figure 2:
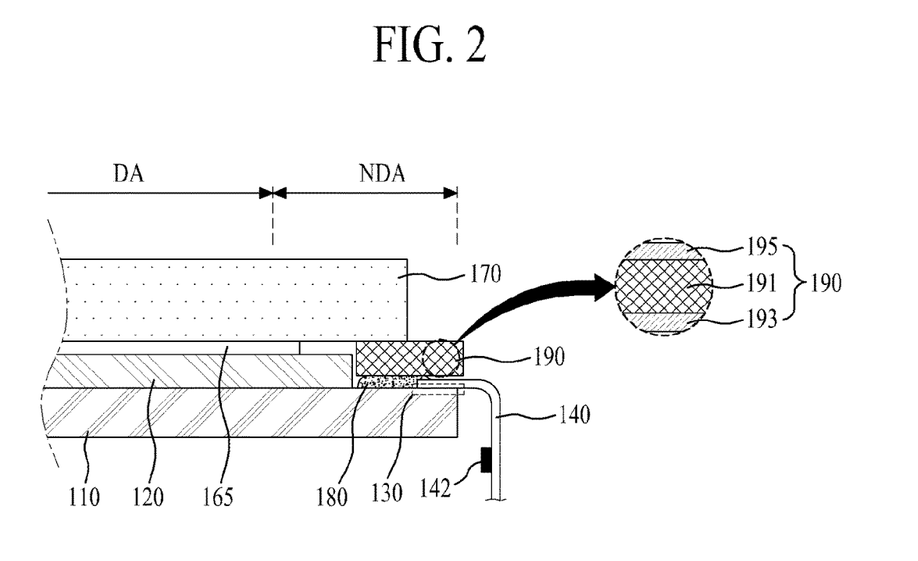
FIG. 2 is a cross-sectional view illustrating a side of a display apparatus according to the embodiment of the present invention.

FIG. 2 is a cross-sectional view illustrating a side of a display apparatus according to one embodiment of the present invention.

Referring to FIG. 2, the display apparatus may include a substrate 110, a display portion 120, a cover window 170, and an insertion member 190.

The substrate 110 may include a display area (DA) in a circular shape, and a non-display area (NDA) in a periphery of the display area (DA). The substrate 110 may be formed of a flexible plastic material, for example, an opaque or colored polyimide (PI) material.

A support substrate (not shown) may be additionally attached to a rear surface of the substrate 110. The support substrate maintains a shape of the substrate 110. The support substrate may be formed of a polymer resin material whose flexibility is lower than that of the substrate 110, for example, any one of PET (polyethyleneterephthalate), PC (polycarbonate), PES (polyethersulfone), PEN (polyethylenapthanate) and PNB (polynorborneen). The substrate 110 may also be formed of a non-flexible material. In this case, the support substrate may be beneficially omitted so as to realize slimness of the display apparatus.

The display portion 120 is formed in a circular shape in the display area (DA) on the substrate 110. The display portion 120 may be an organic light emitting device and include a plurality of pixels. The plurality of pixels display a predetermined image through a light emission of the organic light emitting device in accordance with a driving signal supplied via a display pad 130 at one side of the substrate 110. The display portion 120 may include an encapsulation layer for covering the plurality of pixels.

The display pad 130 is connected with a flexible printed circuit board 140, wherein the display pad 130 transmits driving signals, which are supplied through the flexible printed circuit board 140, to each pixel.

One side of the flexible printed circuit board 140 is attached to the display pad 130, and the other side of the flexible printed circuit board 140 is connected with a driving system of the display apparatus. A display driving integrated circuit 142 is mounted on the flexible printed circuit board 140. The display driving integrated circuit 142 generates driving signals including a data signal and a control signal for controlling the light emission of the organic light emitting device from digital data and control signals supplied from the driving system, and supplies the driving signals to each pixel.

A connection portion between the flexible printed circuit board 140 and the display pad 130 is sealed by a resin coating layer 180. The resin coating layer 180 may improve adhesiveness between the flexible printed circuit board 140 and the display pad 130, and simultaneously reduce or prevent moisture or humidity from being permeated into the connection portion between the flexible printed circuit board 140 and the display pad 130. The resin coating layer 180 may be formed of thermo-curing resin or photo-curing resin that is coated and cured on the connection portion between the flexible printed circuit board 140 and the display pad 130.

Meanwhile, the substrate 110 may include a gate-including circuit (not shown) in the non-display area (NDA) along a curvature of the display area (DA). The gate-including circuit generates a scan signal in response to a scan control signal supplied from the display driving integrated circuit 142, and supplies the generated scan signal to each pixel.

The cover window 170 is formed of a transparent glass or plasmatic material, wherein the cover window 170 is provided in a circular shape. The cover window 170 covers the display portion 120 except the display pad 130 on the substrate 110. The cover window 170, which is attached to the display portion 120 by the use of transparent adhesive 165, transmits the light emitted from the display portion 120 to the external environment.

As illustrated in FIG. 2, the insertion member 190 is disposed in and inserted into a gap space between an edge of the cover window 170 and an edge of substrate 110 confronting each other.

The gap space is provided on the display pad 130 to facilitate connecting the flexible printed circuit board 140 and the display pad 130. During a direct bonding process for attaching the cover window 170 to the display portion 120, micro-cracks may occur in the substrate 110 by an external force such as bonding force or adhering force applied to the substrate 110 overlapped with the gap space.

The insertion member 190 inserted into the gap space may seal the gap space or decrease a step difference between the substrate 110 and the cover window 170, to thereby reduce or prevent the substrate 110 from being damaged during the direct bonding process of the cover window 170 by an external force applied to an edge of the cover window 170 and/or the substrate 110 overlapped with the gap space.

The insertion member 190 according to an example of the present invention may include an elastomer material. The insertion member 190 is attached to an upper surface of the resin coating layer 180 by the use of adhesive (not shown) provided on its lower surface. Furthermore, the insertion member 190 may be additionally attached to a rear surface of the cover window 170 by the use of adhesive provided on its upper surface.

As illustrated in the expanded view of FIG. 2, the insertion member 190 according to another example of the present invention may include a base member 191, a lower layer 193 on a lower surface of the base member 191, and an upper layer 195 on an upper surface of the base member 191. In this case, the base member 191 may be formed of a polymer resin or elastomer material. Each of the lower layer 193 and the upper layer 195 may be selectively formed of a polymer resin or elastomer material, wherein the material for each of the lower layer 193 and the upper layer 195 may be different from that of the base member 191. The insertion member 190 may be attached to an upper surface of the resin coating layer 180 by the use of adhesive (not shown) on a lower surface of the lower layer 193. Furthermore, the insertion member 190 may be additionally attached to a rear surface of the cover window 170 by the use of adhesive on the upper layer 195.

As described above, the insertion member 190 is disposed in and inserted into the gap space between the edge of the substrate 110 and the edge of the cover window 170, and it is thus possible to reduce or prevent the substrate 110 from being damaged during the subsequent bonding process of the cover window 170, thereby improving reliability in the substrate 110.

Figure 3:
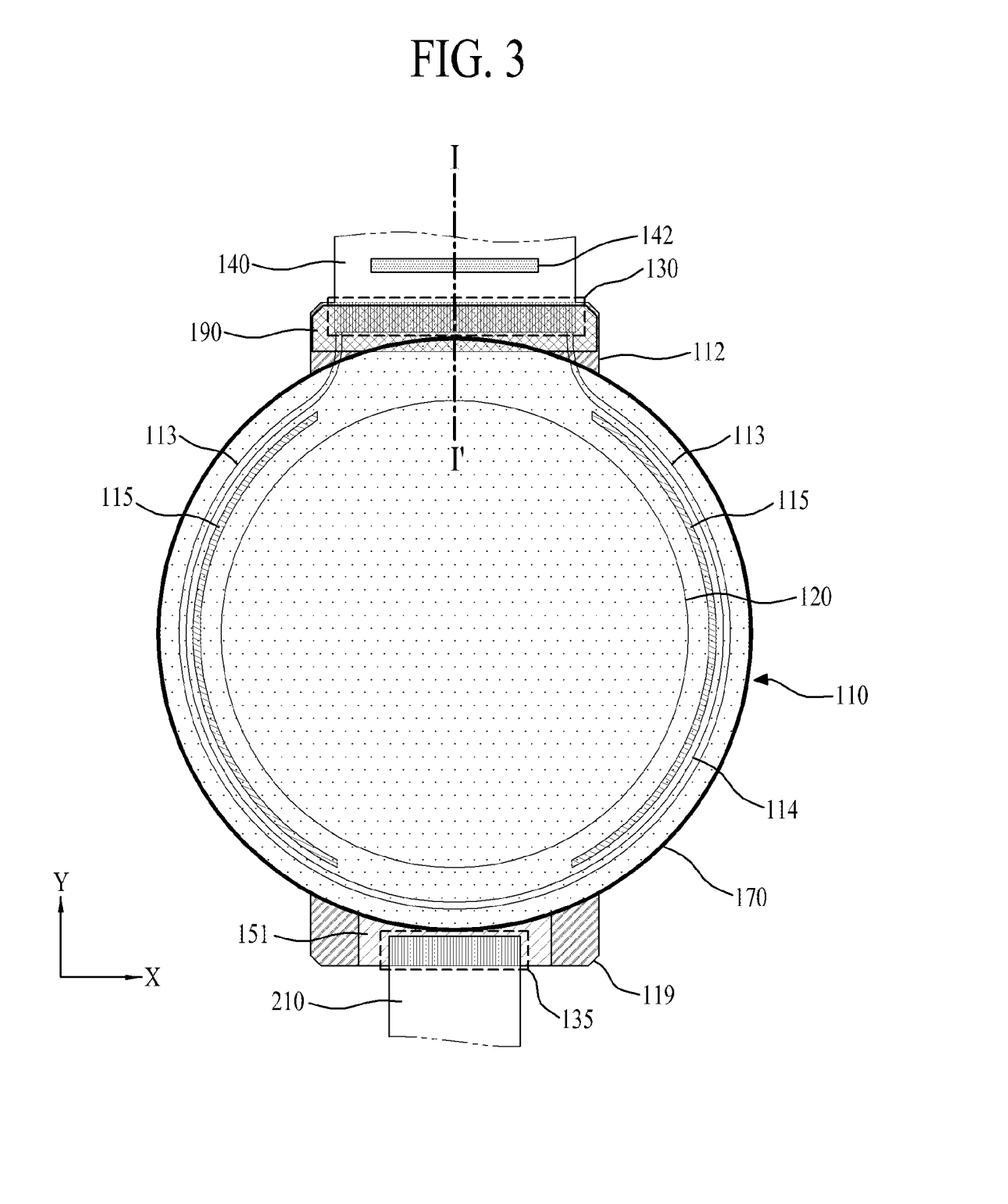
FIG. 3 is a plane view illustrating a display apparatus according to the first embodiment of the present invention.
Figure 4:
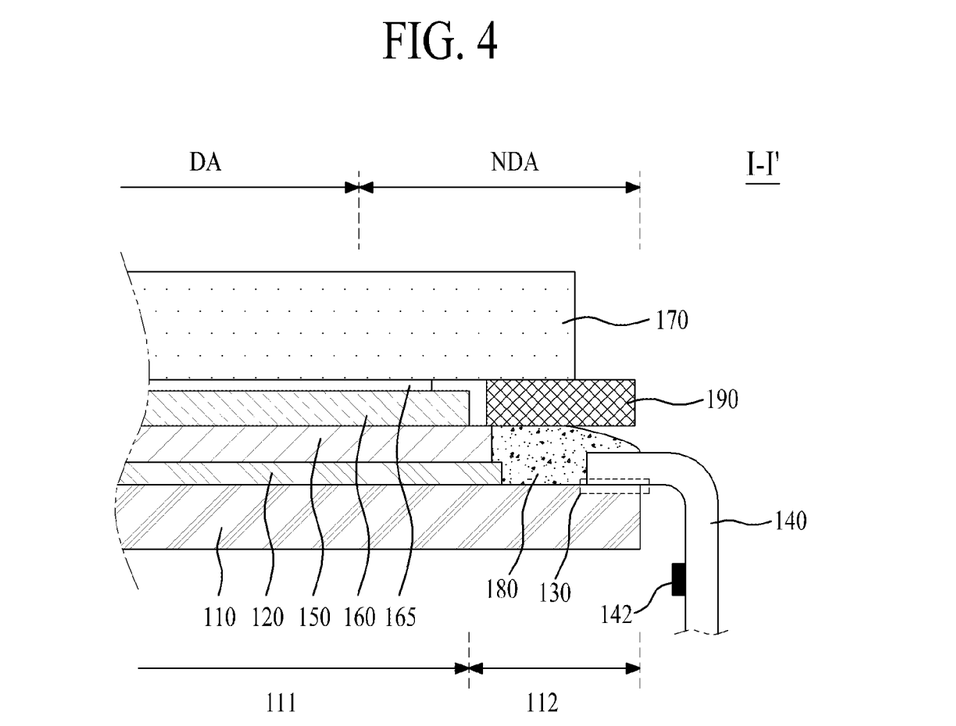
FIG. 4 is a cross-sectional view along I-I' of FIG. 3.
Figure 5:
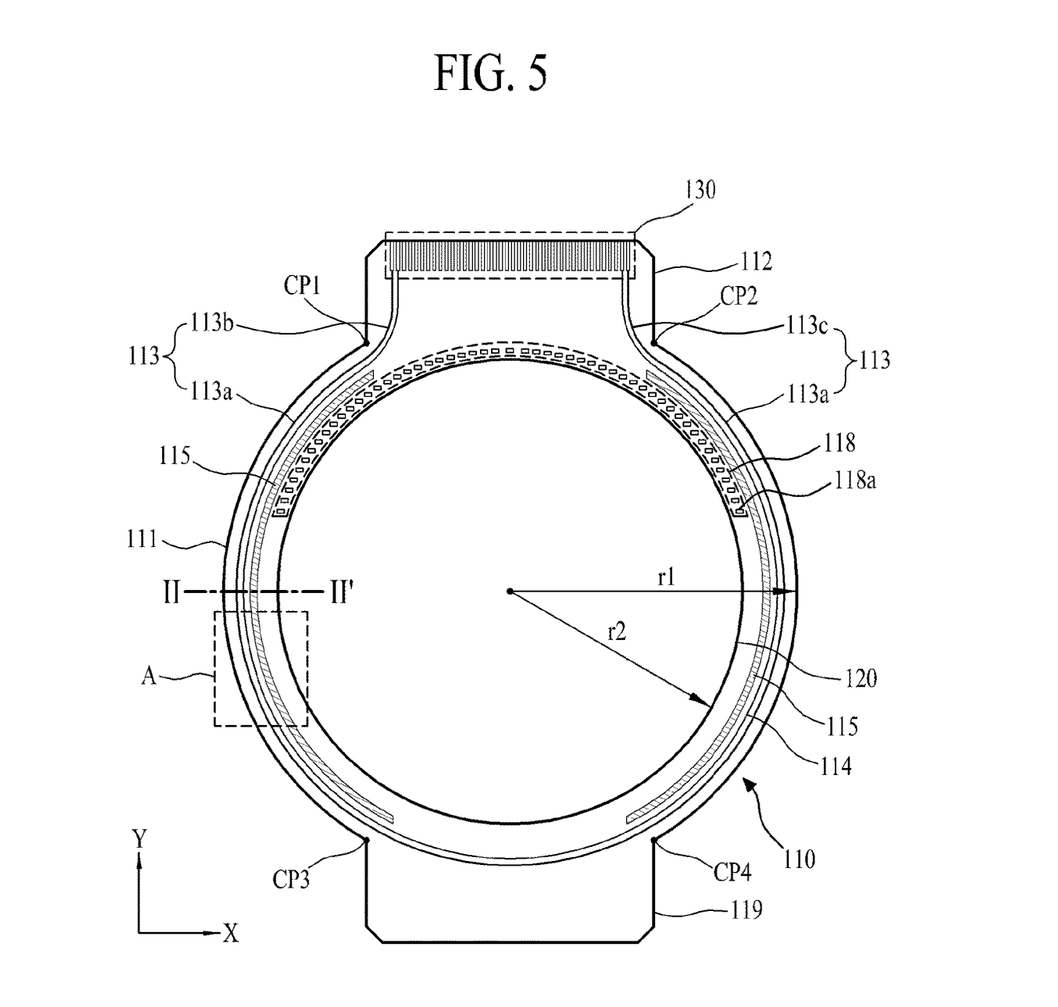
FIG. 5 is a plane view illustrating a substrate of FIG. 3.

FIG. 3 is a plane view illustrating a display apparatus according to the first embodiment of the present invention. FIG. 4 is a cross-sectional view along I-I' of FIG. 3. FIG. 5 is a plane view illustrating a substrate of FIG. 3.

Referring to FIGS. 3 to 5, the display apparatus according to the first embodiment of the present invention may include a substrate 110, a display portion 120, a display pad 130, a flexible printed circuit board 140, a barrier film 150, a polarizing film 160, a cover window 170, a resin coating layer 180 and an insertion member 190.

The substrate 110 may include a circular arc portion 111 and a driving circuit connecting portion 112. As described above, the substrate 110 may be formed of a flexible plastic material.

The circular arc portion 111 is formed in a shape of a circular arc by first and second circumference points (CP1, CP2), each of which has the same first radius (r1) based on a center portion of the display portion 120, wherein the first and second circumference points (CP1, CP2) are connected with each other in a straight line. The circular arc portion 111 may include a display area (DA), and a non-display area (NDA) surrounding the display area (DA).

The display area (DA) is formed in a shape of a circle having a second radius (r2) smaller than the first radius (r1), based on the center portion of the circular arc portion 111. At this time, the circular arc portion 111 and the display area (DA) are substantially formed in a shape of a concentric circle, whereby a bezel width (BW) of the display device, which is defined between an outer sidewall of the substrate 110 and the display area (DA), may be reduced.

The non-display area (NDA) includes a peripheral area of the circular arc portion 111 except the display area (DA).

The driving circuit connecting portion 112 is projected (or extended) from one side of the circular arc portion 111 defined between the first and second circumference points (CP1, CP2).

Figure 6:
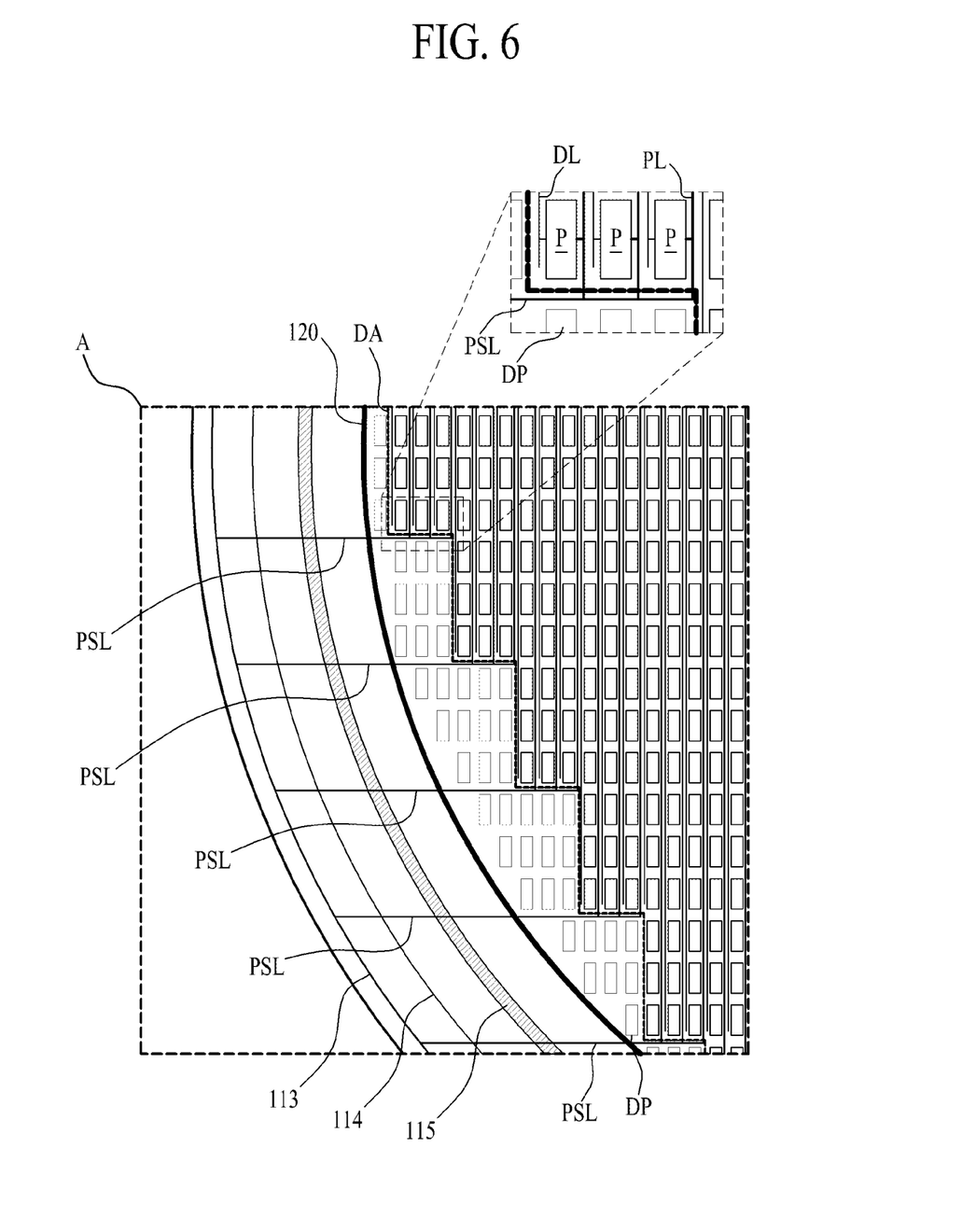
FIG. 6 is an expanded view illustrating 'A' of FIG. 5.
Figure 7:
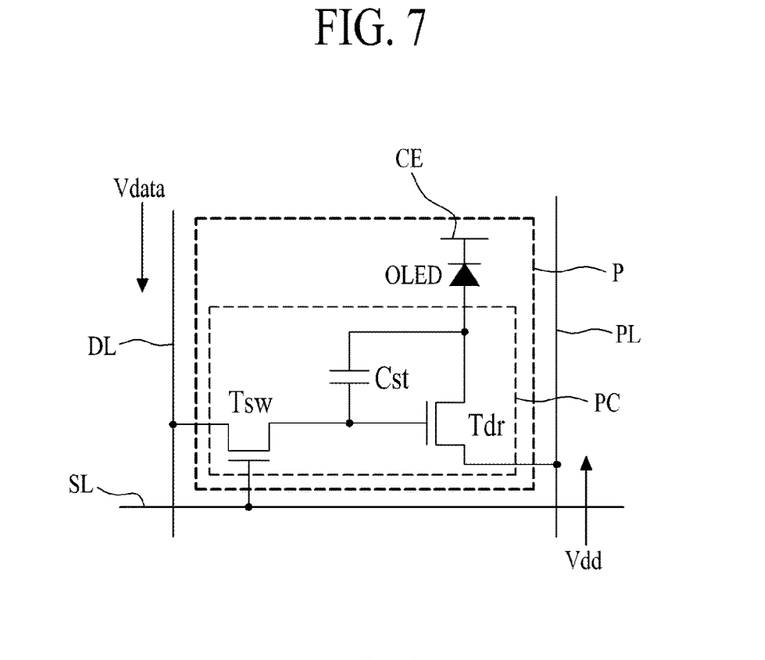
FIG. 7 is a circuit diagram illustrating a pixel of FIG. 6.

The driving circuit connecting portion 112 is prepared in a circular shape on the display area (DA). As illustrated in FIGS. 6 and 7, the display portion 120 may include a plurality of scan lines (SL) disposed at fixed intervals, a plurality of data lines (DL) disposed at fixed intervals and provided in perpendicular to the plurality of scan lines (SL), a plurality of pixel power lines (PL) provided in parallel to the plurality of data lines (DL), and a plurality of pixels (P).

The plurality of pixels (P) are provided in the display area (DA), wherein the plurality of pixels (P) are arranged in a matrix configuration. In this case, the pixels (P) adjacent to the non-display area (NDA) may be provided in a shape of a stair along the circumference of the display area (DA). That is, if rectangular pixels (P) are arranged along the circumference of the display area (DA), the circumference (or outermost portion) of the display area (DA) is substantially formed not in a circular shape but in a stair shape. However, if the display portion 120 has a resolution higher than a certain level, the circumference of the display area (DA) can be perceived as a shape of a circle, although the pixels at the circumference of the display area (DA) are arranged in a fine stair shape. For this reason, the circular arc portion 111 and the display portion 120 can be regarded as being formed substantially in a shape of a concentric circle.

Additionally, the display portion 120 may include dummy pixels (DP) provided in a periphery of the outermost pixels (P) along the circumference of the display area (DA). In this case, the plurality of dummy pixels (DP) are provided in a boundary between the display area (DA) and the non-display area (NDA). The plurality of dummy pixels (DP) reduce or prevent the actual pixels (P) for displaying images from being damaged by external static electricity. At this time, the number of dummy pixels (DP) at both ends of each pixel row along the circumference of the display area (DA) may vary.

Each of the plurality of pixels (P) may include a pixel circuit (PC) and an organic light emitting diode (OLED).

The pixel circuit (PC) is connected to the adjacent scan line (SL), data line (DL) and pixel power line (PL), and controls a current flowing in the organic light emitting diode (OLED) in accordance with a data signal (Vdata) from the data line (DL) in response to the scan signal from the scan line (SL) based on a pixel driving power source (Vdd) supplied to the pixel power line (PL). The pixel circuit (PC) according to an example of the present invention may include a switching transistor (Tsw), a driving transistor (Tdr), and a capacitor (Cst).

As the switching transistor (Tsw) is switched in accordance with the scan signal supplied to the scan line (SL), the switching transistor (Tsw) supplies the data signal (Vdata), which is supplied to the data line (DL), to the driving transistor (Tdr). Also, as the driving transistor (Tdr) is switched in accordance with the data signal (Vdata) supplied from the switching transistor (Tsw), the driving transistor (Tdr) controls a data current flowing to the organic light emitting diode (OLED) from the pixel power line (PL). The capacitor (Cst) is connected between a gate terminal and a source terminal of the driving transistor (Tdr), wherein the capacitor (Cst) stores a voltage corresponding to the data signal (Vdata) supplied to the gate terminal of the driving transistor (Tdr), and turns on the driving transistor (Tdr) by the stored voltage.

The organic light emitting diode (OLED) may include an anode electrode (or pixel electrode) connected to the source terminal of the driving transistor (Tdr), an organic light emitting layer formed on the anode electrode, and a cathode electrode layer (CE) formed on the organic light emitting layer. The organic light emitting diode (OLED) displays a desired image by a light emission in accordance with the data current supplied from the driving transistor (Tdr).

Referring back to FIGS. 3 to 7, a driving power supply line 113, a cathode power supply line 114 and a gate-including circuit 115 are formed on the circular arc portion 111 adjacent to the display portion 120.

The driving power supply line 113 is formed on the substrate 110 along a circumference of the display portion 120, wherein the driving power supply line 113 has predetermined width and thickness, and both ends of the driving power supply line 113 are connected with the display pad 130 in the driving circuit connecting portion 112. The driving power supply line 113 serves as a main power line for supplying the pixel driving power source (Vdd) supplied from the display pad 130 to the plurality of pixel power lines (PL) formed in the display portion 120.

The driving power supply line 113 according to an example of the present invention may be categorized into a circumference line 113a, a first shoulder line 113b, and a second shoulder line 113c in accordance with their positions on the substrate 110.

Figure 8:
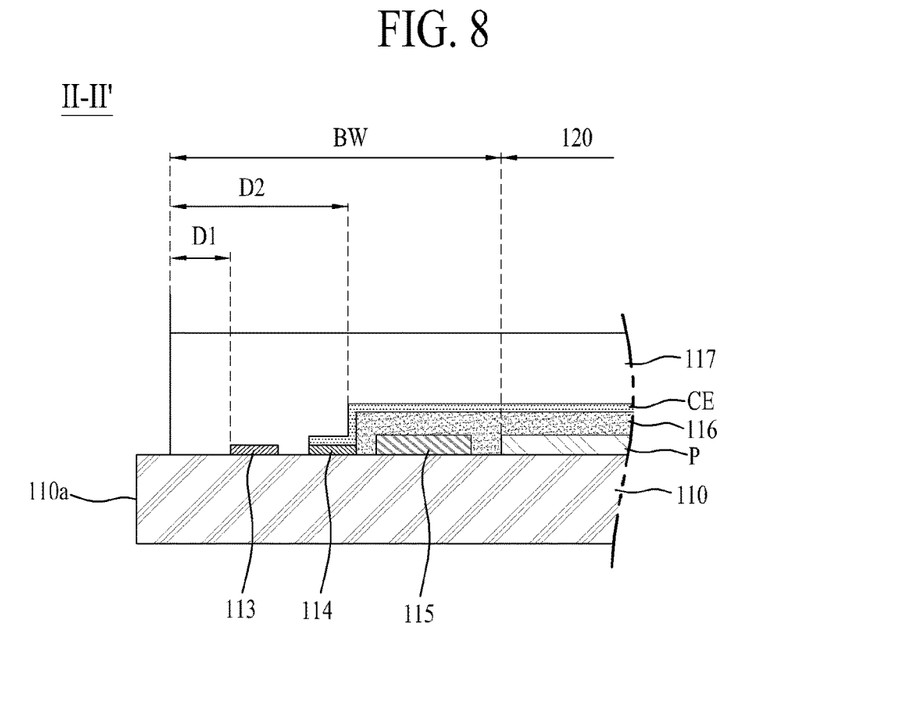
FIG. 8 is a cross-sectional view along II-II' of FIG. 5.

The circumference line 113a is formed along a circumference of the remaining display portion 120 except one side of the display portion 120 adjacent to the driving circuit connecting portion 112. Preferably, the circumference line 113a is formed in a shape of a concentric circle with at least one of the display portion 120 and an outer sidewall of the substrate 110. At this time, as illustrated in FIG. 8, since the driving power supply line 113 is formed at the outmost of the substrate 110, the driving power supply line 113 should be provided at a predetermined distance (D1) from the outer sidewall 110a of the substrate 110 in consideration of inflow of static electricity, etc. If the circumference line 113a is not formed in a shape of a concentric circle with the display portion 120, the distance (D1) between the outer sidewall 110a of the substrate 110 and the circumference line 113a becomes non-uniform, whereby static electricity may be entered from the circumference line 113a arranged to be relatively close to the outer sidewall 110a of the substrate 110. Preferably, the circumference line 113a is formed in a shape of a concentric circle with the display portion 120, and is also formed in a shape of a concentric circle with the outer sidewall 110a of the substrate 110.

As the first shoulder line 113b is formed between one end of the circumference line 113a adjacent to the driving circuit connecting portion 112 and the display pad 130 with a certain curvature, the first shoulder line 113b connects one end of the circumference line 113a to the display pad 130. The first shoulder line 113b is preferably formed with a relatively great curvature to surround the first circumference point (CP1) without being overlapped with the outmost link line formed between the display pad 130 and the display portion 120.

As the second shoulder line 113c is formed between the other end of the circumference line 151 adjacent to the driving circuit connecting portion 112 and the display pad 130 with a certain curvature, the second shoulder line 113c connects the other end of the circumference line 151 to the display pad 130. The second shoulder line 113c is preferably formed with a relatively great curvature to surround the second circumference point (CP2) without being overlapped with the outmost link line formed between the display pad 130 and the display portion 120.

As the pixel driving power source (Vdd), which is supplied from the display pad 130, is supplied to both ends of the circumference line 113a by the use of first and second shoulder lines 113b and 113c, it is possible to reduce or minimize a voltage drop deviation generated in the driving power supply line 113.

The driving power supply line 113 is connected with the pixel power line (PL) for each pixel (P) in the display portion 120 through a plurality of power sharing lines (PSL).

Each of the plurality of power sharing lines (PSL) is a unit of a plurality of pixel groups, wherein each pixel group includes at least two of the pixels (P). Each of the plurality of power sharing lines (PSL) connects the pixel power line (PL) included in each pixel group to the circumference line 113a of the driving power supply line 113. That is, in order to reduce or prevent a signal interference between the pixel driving power source (Vdd) and the data signal (Vdata), each of the plurality of power sharing lines (PSL) is shared by the two or more pixel power lines (PL) included in each of the pixel groups and being not intersected with the data line (DL). In this case, each of the plurality of pixel groups may be comprised of two or more rows of the pixels (P)

connected to the data line (DL) and the pixel power line (PL), wherein the pixel rows may be set previously based on the curvature of the display portion 120 and may be the same as or different from one another.

The cathode power supply line 114 is formed between the driving power supply line 113 and the display portion 120 on the substrate 110 along a circumference of the display portion 120, wherein the cathode power supply line 114 has predetermined width and thickness, and both ends of the cathode power supply line 114 are connected to the display pad 130. The cathode power supply line 114 according to an example of the present invention may be formed in parallel with the driving power supply line 113 while having the same structure as that of the driving power supply line 113. The cathode power supply line 114 is electrically connected with a cathode electrode layer (CE) formed on the circular arc portion 111 to cover the display portion 120, as illustrated in FIG. 8. The cathode power supply line 114 supplies a cathode power, which is supplied from the display pad 130, to the cathode electrode layer (CE), whereby the cathode power is supplied to the organic light emitting diode (OLED) of every pixel (P) formed in the display portion 120 through the cathode electrode layer (CE).

The cathode electrode layer (CE) is formed on a passivation layer 116 for covering the pixel circuit (PC) of each pixel (P), and is electrically connected to the organic light emitting layer of the organic light emitting diode (OLED) formed in each pixel (P). A corner portion of the cathode electrode layer (CE) is directly connected to the cathode power supply line 114.

The cathode electrode layer (CE) is formed between the driving power supply line 113 and the display portion 120, whereby a bezel width (BW) of the display apparatus according to the present invention may be reduced. In more detail, since the passivation layer 116 can be made of an organic material enabling active water permeation, the passivation layer 116 is beneficially provided at a predetermined distance (D2) from the outer sidewall 110a of the substrate 110 to reduce or prevent the organic light emitting diode (OLED) from being damaged by water permeated into the passivation layer 116. As a result, the cathode power supply line 114 according to an example of the present invention is beneficially formed between the driving power supply line 113 and the display portion 120 such that the cathode power supply line 114 may be provided at the predetermined distance (D2) from the outer sidewall 110a of the substrate 110, whereby the passivation layer 116 may be provided at the predetermined distance (D2) from the outer sidewall 110a of the substrate 110, and at the same time the bezel width (BW) of the display apparatus, which is defined by a width between the outer sidewall 110a of the substrate 110 and the display portion 120, may be reduced.

Meanwhile, the cathode electrode layer (CE) may be formed to be more adjacent to the outer sidewall 110a of the substrate 110 than the driving power supply line 113. In this case, the corner portion of the substrate 110 should be extended toward the outskirts to provide the passivation layer 116 at the predetermined distance (D2) from the outer sidewall 110a of the substrate 110, which may increase the bezel width (BW) of the display apparatus. In order to reduce the bezel width (BW) of the display apparatus and to provide the passivation layer 116 at the predetermined distance (D2) from the outer sidewall 110a of the substrate 110, the cathode power supply line 114 can be preferably formed between the driving power supply line 113 and the display portion 120.

The cathode electrode layer (CE) is covered by an encapsulation layer 117. The encapsulation layer 117 may be formed in a multi-layered structure in which an organic material layer or an inorganic material layer, the organic material layer and the inorganic material layer are deposited alternately.

To form a thin film transistor in each pixel (P), the gate-including circuit 115 is formed in a shape of a circular arc along a circumference of the display portion 120 on the substrate 110, and is connected to each of the plurality of scan lines (SL). The gate-including circuit 115 generates the scan signal in response to the scan control signal supplied from the display pad 130, and sequentially supplies the generated scan signal to the plurality of scan lines (SL). The gate-including circuit 115 may be formed along a left or right circumference of the display portion 120, to thereby supply the scan signal to one end of the other end of each of the plurality of scan lines (SL). Alternatively, the gate-including circuit 115 may be formed along the left and right circumferences of the display portion 120, to thereby supply the scan signal to both ends of each of the plurality of scan lines (SL). Also, the gate-including circuit 115 may be formed along the left and right circumferences of the display portion 120, to thereby supply the scan signal to one end of the odd numbered scan lines (SL) and to supply the scan signal to the other end of the even numbered scan lines (SL).

Referring back to FIGS. 3 to 5, the display pad 130 is prepared in the outer circumference of the driving circuit connecting portion 112. The display pad 130 may include a plurality of data pads, first and second driving power pads respectively connected to the first and second shoulder lines 113b and 113c, first and second cathode power pads respectively connected with one end and the other end of the cathode power supply line 114, and a plurality of gate pads connected with the gate-including circuit 115.

The plurality of data pads are connected on one-to-one correspondence to the plurality of data lines (DL) by a plurality of data link lines. The first and second driving power pads are connected on one-to-one correspondence to the first and second shoulder lines 113b and 113c. The first and second cathode power pads are connected on one-to-one correspondence to one end and the other end of the cathode power supply line 114. The plurality of gate pads are connected to the gate-including circuit 115 by a plurality of gate control link lines.

The flexible printed circuit board 140 is attached to the display pad 130 by a bonding process, wherein the flexible printed circuit board 140 is formed of TCP (Tape Carrier Package) or COF (Chip On Flexible Board or Chip On Film). The flexible printed circuit board 140 is bent toward a rear surface of the substrate 110 so as to surround a lateral surface of the substrate 110, and is connected to a driving system.

The display driving integrated circuit 142 is mounted on the flexible printed circuit board 140.

The display driving integrated circuit 142 receives a timing synchronization signal and video data supplied from the driving system, converts the video data into the data signal in accordance with the timing synchronization signal, generates a gate control signal in accordance with the timing synchronization signal so as to supply the data signal to the data line (DL) for each pixel (P) through the display pad 130, and supplies the gate control signal to the gate-including circuit 115 through the display pad 130.

The connection portion between the flexible printed circuit board 140 and the display pad 130 may be covered by the resin coating layer 180.

The resin coating layer 180 is provided to cover the connection portion between the flexible printed circuit board 140 and the display pad 130 by a coating and curing process of a resin material, thereby improving adhesiveness between the flexible printed circuit board 140 and the display pad 130, and simultaneously reducing or preventing moisture or humidity from being permeated into the connection portion between the flexible printed circuit board 140 and the display pad 130. The resin coating layer 180 according to an example of the present invention may be formed of thermo-curing resin or photo-curing resin.

Referring back to FIGS. 3 and 4, the barrier film 150 is provided on the substrate 110 so as to cover the display portion 120. In this case, the barrier film 150 may be attached to the encapsulation layer 117 on the upper surface of the display portion 120 by the use of transparent adhesive (not shown). The barrier film 150 may be formed of a material with low water permeability, for example, polymer. Meanwhile, a lateral side of the barrier film 150 and a lateral side of the display portion 120 adjacent to the display pad 130 may be sealed by the resin coating layer 180.

The polarizing film 160 is attached to an upper surface of the barrier film 150, wherein the polarizing film 160 polarizes the light emitted from the display portion 120.

The cover window 170 is formed of a transparent glass or plasmatic material, wherein the cover window 170 is provided in a circular shape. The cover window 170 covers the remaining upper surface of the substrate 100 except the display pad 130 on the substrate 110. The cover window 170 is attached to the display portion 120, that is, the upper surface of the polarizing film 160 by the use of transparent adhesive 165 such as OCA (Optical Clear Adhesive), wherein the cover window 170 transmits the light emitted from the display portion 120 to the external environment, and protects the display portion 120. For connection between the flexible printed circuit board 140 and the display pad 130, the gap space is prepared between the cover window 170 and the driving circuit connecting portion 112 of the substrate 110.

Additionally, the cover window 170 may be attached to the substrate 110 by a direct bonding process using a roller. The direct bonding process according to an example of the present invention may include arranging the cover window 17 on a bonding stage, arranging the substrate 110, which is inverted in a top-and-bottom side, on the cover window 170, attaching the substrate 110 to the cover window 170 by pressing the substrate 110 through the use of pressing roller, and curing the transparent adhesive 165 by ultraviolet rays or heat. At this time, the transparent adhesive 165 may be coated onto at least one of the substrate 110 and the cover window 170.

The insertion member 190 is disposed in and inserted into the gap space between an edge of substrate 110, that is, between the driving circuit connecting portion 112 and the cover window 170 confronting each other. In other words, the insertion member 190 is provided between the resin coating layer 180 and the cover window 170. The insertion member 190 may be attached to the upper surface of the resin coating layer 180, and furthermore, may be attached to the rear surface of the cover window 170. The insertion member 190 seals the gap space or serves to decrease a step difference between the substrate 110 and the cover window 170 confronting each other with the gap space in-between, to thereby reduce or prevent the substrate 110 from being damaged during the direct bonding process of the cover window 170.

Referring back to FIGS. 3 to 5, the display apparatus according to the first embodiment of the present invention may further include a selective portion 118 prepared between the display portion 120 and the display pad 130.

The selective portion 118 is prepared along an upper circumference of the display portion 120 adjacent to the display pad 130. The selective portion 118 may include a plurality of selective circuits 118a connected in a unit of two or more data lines. Each of the plurality of selective circuits 118a is connected to a plurality of data groups, each of which includes two or more data lines (DL), on one-to-one correspondence, thereby driving the data lines (DL in each data group in a time-division method. Each of the plurality of selective circuits 118a according to an example of the present invention may be a multiplexing circuit, for example, multiplexer, which has one input terminal and two or more output terminals. The data signal (Vdata) is supplied from the display driving integrated circuit 142 to each input terminal of the plurality of selective circuits 118a. The output terminals of the plurality of selective circuits 118a are connected on one-to-one correspondence to the data lines (DL) in each data group. Each of the plurality of selective circuits 118a sequentially supplies the data signal (Vdata), which is supplied to the input terminal, to the data lines (DL) in each data group in response to a time-division selective signal.

In the display apparatus including the selective portion 118 according to the first embodiment of the present invention, the number of data link lines for connecting the display pad 130 and the data line (DL) is decreased so that a formation area of the data link lines is also decreased, to thereby reduce the length between the first and second circumference points (CP1, CP2). Accordingly, it may be possible to provide the display portion 120 and the circular arc portion 111 of the substrate 110 in a more concentric circle, and furthermore to realize the display apparatus with a more-reduced bezel width (BW).

In the display apparatus according to the first embodiment of the present invention, the barrier film 150 may include a base film, a touch sensing portion prepared on the base film, and a touch circuit connecting portion 151 protruding (or extending) from a lower side of the base film.

The base film may be formed of a material with low water permeability, for example, polymer.

The touch sensing portion includes a touch driving line and a touch sensing line overlapped with the display portion 120 and prepared in a touch sensing area defined on the base film.

The touch circuit connecting portion 151 protrudes (or extends) at a predetermined size from the lower side of the base film, wherein the touch circuit connecting portion 151 is disposed on a support portion 191 of the substrate 110. At this time, the support portion 119 may be protruding (or extending) from the other side of the circular arc portion 111 defined between third and fourth circumference points (CP3, CP4) having the same first radius (r1) based on the center portion of the display portion 120.

The touch circuit connecting portion 151 may include a plurality of touch driving link lines connected with the touch driving line of the touch sensing area, a plurality of touch sensing link lines connected with the touch sensing line of the touch sensing area, and a touch pad portion 153 including a plurality of touch pads connected on one-to-one correspondence to the plurality of touch driving link lines and the touch sensing link lines.

The touch pad portion 153 is connected to a touch flexible printed circuit board 200 by a bonding process, and the touch flexible printed circuit board 200 is bent toward the rear surface of the substrate 110 so as to surround the lateral surface of the substrate 110, and is connected with a touch driving circuit (not shown). At this time, a connection portion between the touch pad portion 153 and the touch flexible printed circuit board 200 may be sealed by the resin coating layer 180, to thereby improve adhesiveness between the touch pad portion 153 and the touch flexible printed circuit board 200, and to reduce or prevent moisture or humidity from being permeated into the connection portion between the touch pad portion 153 and the touch flexible printed circuit board 200.

Meanwhile, the barrier film 150 may be formed of the base film alone without the touch sensing area, the touch circuit connecting portion 151 and the touch pad portion 153. In this case, a touch screen (not shown) may be disposed between the barrier film 150 and the polarizing film 160. The touch screen may include a touch base film, a touch sensing portion prepared on the touch base film, and a touch circuit connecting portion having a touch pad portion protruding (or extending) from a lower side of the base film and being connected with the touch sensing portion.

In the display apparatus according to the first embodiment of the present invention, the insertion member 190 is disposed in and inserted into the gap space between the substrate 110 and the cover window 170 being adjacent to the display pad 130 and confronting each other so that it is possible to seal the gap space or to decrease the step difference between the substrate 110 and the cover window 170 in the gap space. As a result, it is possible to reduce or prevent the substrate 110 from being damaged by the gap space during a direct bonding process of the substrate 110 and the cover window 170, and to reduce or prevent the substrate 100 or the cover window 170 overlapped in the gap space from the damaged by an external force. Also, the display apparatus according to the first embodiment of the present invention is provided with the circular arc portion 111 and the display portion 120 formed in the concentric shape so that it is possible to reduce the bezel width (BW) and to thereby reduce a length of the gap space, that is, a length of a long side of the driving circuit connecting portion.

Figure 9A:
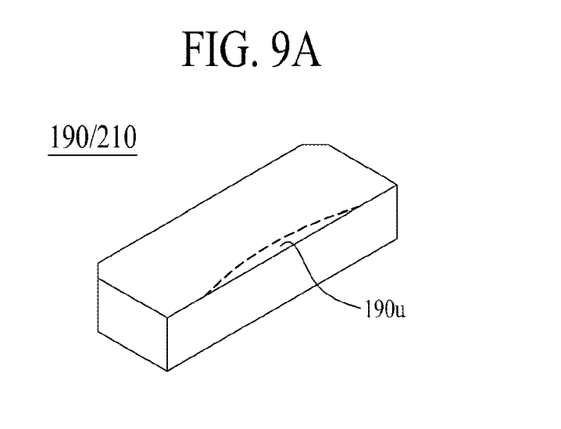
FIGS. 9A to 9C illustrate various examples of an insertion member in a display apparatus according to embodiments of the present invention.
Figure 9B:
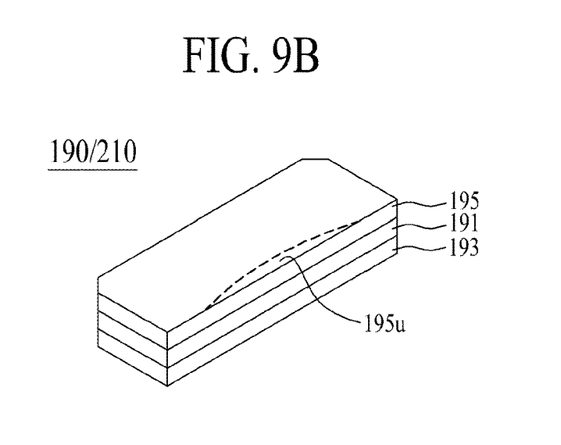
Figure 9C:
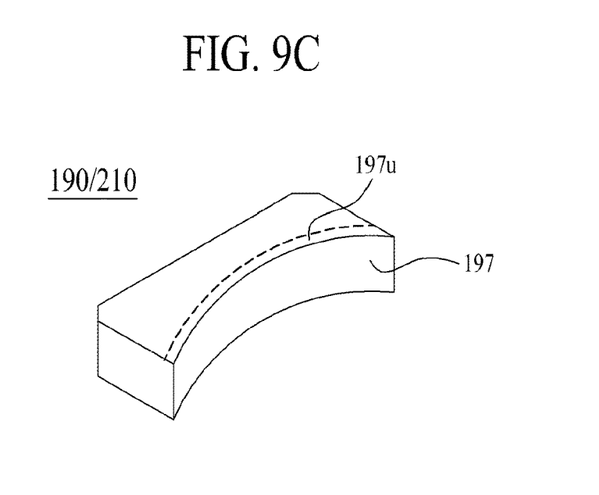

FIGS. 9A to 9C illustrate various examples of an insertion member according to embodiments of the present invention.

First, as illustrated in FIG. 9A, an insertion member 190 according to the first example of the present invention may be formed of an elastomer material, and may be provided in a polygonal shape, for example, a rectangular shape. The rear surface of the insertion member 190 may be attached to an upper surface of the resin coating layer (180, See FIG. 4), and some parts 190u of an upper surface of the insertion member 190 overlapped with the cover window (170, See FIG. 4) may be pressed by an edge of the rear surface of the cover window, or may be attached to the edge of the rear surface of the cover window by the use of adhesive. In this case, if some parts 190u of the upper surface of the insertion member 190 overlapped with the cover window (170, See FIG. 4) are pressed by the edge of the rear surface of the cover window, a thickness of the insertion member 190 may be greater than a distance between the resin coating layer and the cover window by a preset thickness. The insertion member 190 according to the first example of the present invention seals a gap space between the substrate and the cover window confronting each other. Also, the insertion member 190 according to the first example of the present invention is formed of an elastic material so that it is possible to absorb an external force applied to the edge of cover window and/or substrate overlapped with the gap space.

As illustrated in FIG. 9B, an insertion member 190 according to the second example of the present invention may have a polygonal shape, for example, a rectangular shape, wherein the insertion member 190 according to the second example of the present invention may include a base member 191, a lower layer 193, and an upper layer 195.

The base member 191 according to an example of the present invention may be formed of a polymer resin material, or may be formed of the same material as that of the substrate.

The base member 191 according to another example of the present invention may be formed of an elastomer material.

The lower layer 193 according to an example of the present invention is attached to a lower surface of the base member 191. The lower layer 193 may be formed of an elastomer material or polymer resin material, wherein the material of the lower layer 193 may be different from that of the base member 191. The lower layer 193 may be attached to an upper surface of the resin coating layer (180, See FIG. 4) by the use of adhesive (not shown).

The upper layer 195 according to an example of the present invention may be formed of the same material as that of the lower layer 193. Also, some parts 195u of an upper surface of the upper layer 195 overlapped with the cover window (170, See FIG. 4) may be pressed by an edge of the rear surface of the cover window, or may be attached to the edge of the rear surface of the cover window by the use of adhesive.

The insertion member 190 according to the second example of the present invention seals a gap space between the substrate and the cover window confronting each other. Also, the insertion member 190 according to the second example of the present invention is formed in a dual-layered structure including an elastic material so that it is possible to absorb an external force applied to the edge of cover window and/or substrate overlapped with the gap space.

As illustrated in FIG. 9C, an insertion member 190 according to the third example of the present invention may be formed of an elastomer material, and may be provided in a polygonal shape with a curvature portion 197, for example, a rectangular shape. The curvature portion 197 is concavely prepared along a curvature of the cover window from an inner surface of the insertion member 190 confronting the display portion 120. An upper edge 197u of the curvature portion 197 may be pressed by an edge of the rear surface of the cover window, or may be attached to the edge of the rear surface of the cover window by the use of adhesive. In the insertion member 190 according to the third example of the present invention, the curvature portion 197 is concavely provided along a curvature of the cover window so that it is possible to seal an entire gap space between the substrate and the cover window on the driving circuit connecting portion.

Additionally, as shown in FIG. 9B, the insertion member 190 according to the third example of the present invention may be formed in a three-layered structure including a base member 191, a lower layer 193 and an upper layer 195.

Figure 10:
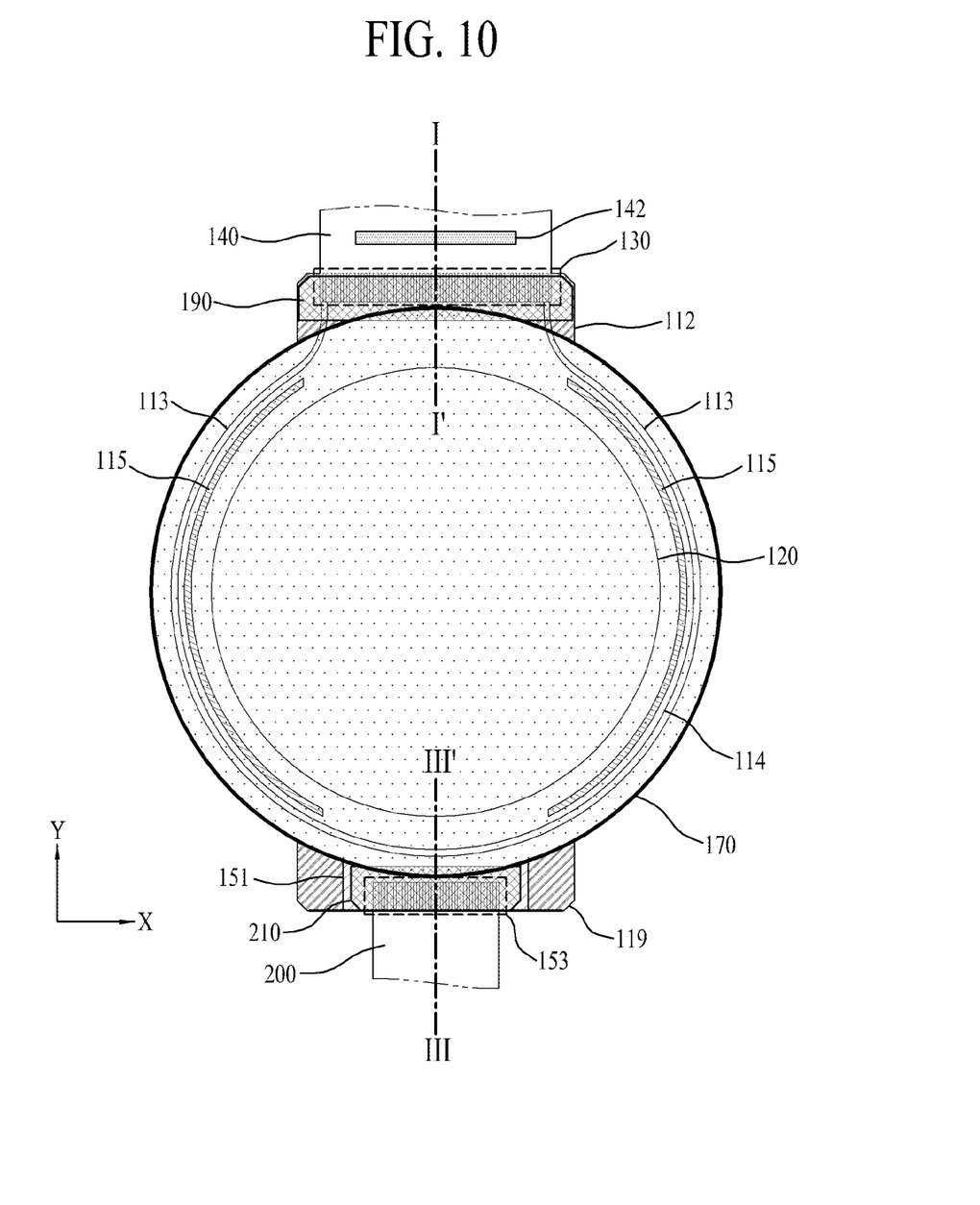
FIG. 10 is a plane view illustrating a display apparatus according to the second embodiment of the present invention.
Figure 11:
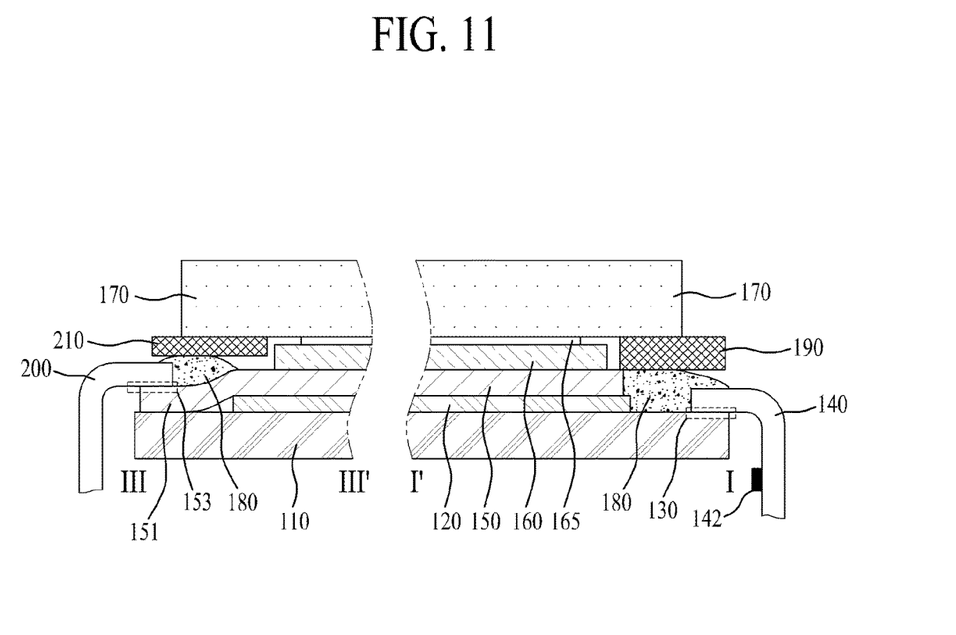
FIG. 11 is a cross-sectional view along I-I' and III-III' of FIG. 10.

FIG. 10 is a plane view illustrating a display apparatus according to the second embodiment of the present invention. FIG. 11 is a cross-sectional view along I-I' and III-III' of FIG. 10, wherein an auxiliary insertion member is additionally inserted into a gap space between a cover window and a touch circuit connecting portion prepared on a barrier film. Except the auxiliary insertion member 210, other elements of the display apparatus according to the second embodiment of the present invention are the same as those of the display apparatus according to the first embodiment of the present invention, which are illustrated in FIGS. 3 to 8. Thus, a detailed description for the same or similar parts will be omitted.

Referring to FIGS. 10 and 11, the auxiliary insertion member 210 is inserted into a gap space between a cover window 170 and a touch circuit connecting portion 151 prepared on a lower surface of a barrier film 150. At this time, the gap space between the touch circuit connecting portion 151 and the cover window 170 may occur on the touch circuit connecting portion 151 for a connection between a touch flexible printed circuit board 200 and a touch pad portion 153. As the auxiliary insertion member 210 is provided in the gap space between the touch circuit connecting portion 151 and the cover window 180, it is possible to seal the gap space or to reduce a step difference between the cover window 170 and the touch circuit connecting portion 1 151 of the barrier film 150 confronting each other with the gap space in-between, thereby reducing or preventing the substrate 110 from being damaged during a bonding process of the cover window 170. The auxiliary insertion member 210 may be similar or the same in structure as the insertion member 190 illustrated in any one of FIGS. 9A to 9C. The auxiliary insertion member 210 may be prepared between the cover window 170 and the touch circuit connecting portion 151 in accordance with similar or the same manufacturing method as that of the insertion member 190.

Figure 12:
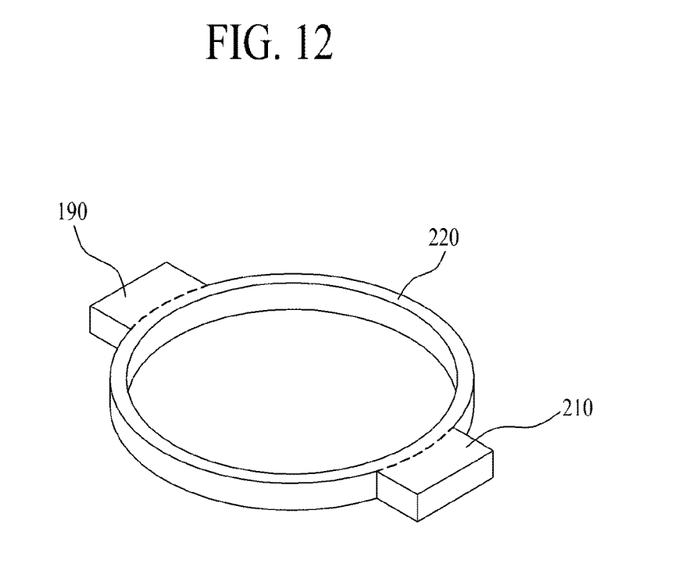
FIG. 12 illustrates a connection ring member for connecting an insertion member and an auxiliary insertion member illustrated in FIG. 10.

As illustrated in FIG. 12, the aforementioned insertion member 190 and the auxiliary insertion member 210 may be connected with each other through the use of connection ring member 220. That is, the insertion member 190 is protruding from one side of the connection ring member 220, and the auxiliary insertion member 210 is protruding from the other side of the connection ring member 220. The connection ring member 220, the insertion member 190 and the auxiliary insertion member 210 may be formed as one body.

The connection ring member 220 is formed in a ring shape while being overlapped with an edge of the cover window (170 in FIG. 11). The connection ring member 220 is disposed in and inserted into a gap space between an edge of cover window and an edge of circular arc portion (111 in FIG. 11) of the substrate 110, to thereby reduce or prevent foreign matters from being permeated into the gap space between the edge of the cover window and the edge of the circular arc portion 111 of the substrate 110.

In the display apparatus according to the second embodiment of the present invention, it is possible to reduce or prevent the substrate 110 from being damaged by the gap space between the substrate 110 and the cover window 170 respectively adjacent to the display pad 130 and the touch pad portion 153 during a direct bonding process between the substrate 110 and the cover window 170, or to reduce or prevent the substrate 110 or the cover window 170 overlapped with the gap space from being damaged by an external force.

According to an embodiment of the present invention, the insertion member 190 is provided in the gap space between the edge of the substrate 110 and the edge of the cover window 170 so that it is possible to reduce or prevent the substrate 110 from being damaged by the external force applied to the edge of the cover window 170 and/or the substrate 110 overlapped with the gap space, thereby improving reliability of the substrate 110.

Also, the bezel width (BW) can be reduced by the circular arc portion 111 and the display portion 120 formed in a shape of concentric circle.

Also, the driving power supply line 113 is prepared in the periphery of the circular arc portion 111, and the cathode power supply line 114 is prepared between the driving power supply line 113 and the display portion 120 so that it is possible to realize a more-reduced bezel width (BW).

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display apparatus comprising:
   a display portion including a plurality of pixels on a substrate;
   a driving circuit connecting portion outside the display portion on the substrate;
   a plurality of display pads in the driving circuit connecting portion that are electrically connected to the plurality of pixels, respectively;
   a flexible printed circuit board attached to the plurality of display pads;
   a resin coating layer that covers a connection portion between the plurality of display pads and the flexible printed circuit board;
   a cover window on the substrate that covers the display portion and exposes a part of the substrate; and
   an insertion member in the driving circuit connecting portion in a gap space between the substrate and the cover window,
   wherein the insertion member is interposed between the resin coating layer and the cover window and is extended over to the exposed part of the substrate.

2. The display apparatus according to claim 1, wherein the display portion has a circular shape.

3. The display apparatus according to claim 1, wherein, the substrate includes a circular arc portion with the display portion, and the driving circuit connecting portion protruding from one side of the circular arc portion, and
   the exposed part of the substrate includes at least a part of the driving circuit connecting portion.

4. The display apparatus according to claim 3, wherein, the cover window is prepared in a circular shape for covering at least a part of the driving circuit connecting portion and the display portion, and
   the insertion member is prepared in a polygonal shape being overlapped with an edge of the cover window.

5. The display apparatus according to claim 4, wherein the insertion member has a curvature portion provided in an inner surface confronting the display portion along a curvature of the cover window.

6. The display apparatus according to claim 1, wherein the insertion member includes:
   a base member;
   an upper layer on an upper surface of the base member; and
   a lower layer on a lower surface of the base member.

7. The display apparatus according to claim 6, wherein, the base member includes a polymer resin or elastomer material, and each of the upper layer and the lower layer selectively includes the polymer resin or elastomer material, wherein the material for each of the lower layer and the upper layer is different from that of the base member.

8. The display apparatus according to claim 3, further comprising:
a barrier film between the display portion and the cover window, wherein the barrier film includes a touch sensing portion overlapped with the display portion, and a touch circuit connecting portion having a touch pad portion connected with the touch sensing portion and overlapped with the edge of the cover window; and
an auxiliary insertion member inserted into a space between the touch circuit connecting portion and the edge of the cover window, wherein
the substrate further includes a support portion protruding from the circular arc portion, and supporting the touch circuit connecting portion.

9. The display apparatus according to claim 8, further comprising
a connection ring member between an edge of the circular arc portion and the edge of the cover window, wherein
the insertion member, the auxiliary insertion member and the connection ring member are included as one body.

10. A display apparatus comprising:
a display portion having a circular shape on a circular arc portion of a substrate, the substrate including the circular arc portion and a driving circuit connecting portion protruding from one side of the circular arc portion;
a display pad in the driving circuit connecting portion and connected with a pixel of the display portion;
a flexible printed circuit board attached to the display pad;
a resin coating layer that covers a connection portion between the display pad and the flexible printed circuit board;
a cover window in a circular shape on the substrate that covers the display portion; and
an insertion member in a gap space between an edge of the substrate and an edge of the cover window, and interposed between the resin coating layer and the cover window in a first area of the driving circuit connecting portion and is not covered by the cover window in a second area of the driving circuit connecting portion.

11. The display apparatus according to claim 10, wherein, the insertion member is prepared in a polygonal shape being overlapped with the edge of the cover window.

12. The display apparatus according to claim 11, wherein the insertion member has a curvature portion provided in an inner surface confronting the display portion along a curvature of the cover window.

13. The display apparatus according to claim 10, wherein the insertion member includes an elastomer material.

14. The display apparatus according to claim 10, wherein the insertion member includes:
a base member;
an upper layer prepared on an upper surface of the base member; and
a lower layer prepared on a lower surface of the base member.

15. The display apparatus according to claim 14, wherein,
the base member includes a polymer resin or elastomer material, and
each of the upper layer and the lower layer selectively includes the polymer resin or elastomer material, wherein the material for each of the lower layer and the upper layer is different from that of the base member.

16. The display apparatus according to claim 10, further comprising:
a barrier film prepared between the display portion and the cover window, wherein the barrier film includes a touch sensing portion overlapped with the display portion, and a touch circuit connecting portion having a touch pad portion connected with the touch sensing portion and overlapped with the edge of the cover window; and
an auxiliary insertion member inserted into a space between the touch circuit connecting portion and the edge of the cover window, wherein
the substrate further includes a support portion protruding from the circular arc portion, and supporting the touch circuit connecting portion.

17. The display apparatus according to claim 16, further comprising
a connection ring member prepared between the edge of the circular arc portion and the edge of the cover window, wherein
the insertion member, the auxiliary insertion member and the connection ring member are included as one body.

18. The display apparatus according to claim 10, wherein the display portion includes a cathode electrode layer and a pixel power line connected with the pixel,
wherein the substrate further includes:
a driving power supply line connected with the pixel power line and prepared in the periphery of the circular arc portion along the circumference of the remaining parts of the display portion except the display portion adjacent to the display pad; and
a cathode power supply line connected with the cathode electrode layer and prepared between the driving power supply line and the display portion.

* * * * *